United States Patent [19]

Pernisz

[11] Patent Number: 5,422,982
[45] Date of Patent: Jun. 6, 1995

[54] NEURAL NETWORKS CONTAINING VARIABLE RESISTORS AS SYNAPSES

[75] Inventor: Udo C. Pernisz, Midland, Mich.

[73] Assignee: Dow Corning Corporation, Midland, Mich.

[21] Appl. No.: 2,355

[22] Filed: Jan. 6, 1993

Related U.S. Application Data

[63] Continuation-in-part of Ser. No. 915,572, Jul. 20, 1992, Pat. No. 5,283,545, which is a continuation-in-part of Ser. No. 694,721, May 2, 1991, Pat. No. 5,312,684.

[51] Int. Cl.$^6$ ............ G06F 15/18; G11C 11/56; H01L 29/78
[52] U.S. Cl. ............ 395/24; 326/35
[58] Field of Search ............ 307/201; 395/24, 25; 364/807

[56] References Cited

U.S. PATENT DOCUMENTS

| | | | |
|---|---|---|---|
| 3,149,398 | 9/1964 | Sprague | 29/25 |
| 3,271,591 | 9/1966 | Ovshinsky | 307/88 |
| 3,943,554 | 3/1976 | Russell et al. | 357/34 |
| 3,953,375 | 4/1976 | Nagano | 252/520 |
| 4,052,340 | 10/1977 | Einthoven | 252/518 |
| 4,756,977 | 7/1988 | Haluska | 428/704 |
| 4,839,700 | 6/1989 | Ramesham et al. | 357/2 |
| 4,945,257 | 7/1990 | Marrocco, III | 307/201 |
| 5,151,384 | 9/1992 | Williams | 437/170 |
| 5,172,204 | 12/1992 | Hartstein | 307/201 |
| 5,293,335 | 3/1994 | Pernisz et al. | 365/148 |

FOREIGN PATENT DOCUMENTS

WO9000826 1/1990 WIPO.

OTHER PUBLICATIONS

Bullot et al., Physica Status Solidi, (a) 71, K1–K4 (1982).
Ansari et al., Journal of Physics, 20, (1987), pp. 1063–1066.
Ramesham et al., NASA Tech Briefs, Dec. 1989, p. 28.
Morgan et al., Thin Solid Films, 15 (1973) pp. 123–131.
Simmons, Handbook of Thin Film Technology, Chapter 14 (1970) pp. 14–38 to 14–43.
Al-Ismail et al., Journal of Material Science, 20 (1985) pp. 2186–2192.
Morgan et al., Thin Solid Films, 20, (1974), pp. S7–S9.
Boelle et al., Applied Surface Science, 46, (1990) pp. 200–205.
Klein, Journal of Applied Physics, vol. 40, No. 7, Jun. (1969), pp. 2728–2740.

Primary Examiner—Robert W. Downs
Attorney, Agent, or Firm—Roger E. Gobrogge

[57] ABSTRACT

A synthetic neural network having a plurality of neuronal elements arranged in an input layer, an output layer, and a hidden layer between the input layer and the output layer. The network has a first plurality of synaptic weighting elements interconnecting the neuronal elements of the input layer with the neuronal elements of the hidden layer, and a second plurality of synaptic weighting elements interconnecting the neuronal elements of the hidden layer with the neuronal elements of the output layer. The improvement involves the synaptic weighting elements in the synthetic neural network being in the form of a silicon dioxide film derived from a hydrogen silsesquioxane resin. Such a silicon dioxide film is characterized by a jV curve which includes both linear and non-linear regions.

13 Claims, 5 Drawing Sheets

NEURAL NETWORKS CONTAINING VARIABLE RESISTORS AS SYNAPSES

This application is a continuation-in-part of U.S. Ser. No. 07/915,572, filed Jul. 20, 1992, now U.S. Pat. No. 5,283,545, which is a continuation-in-part of U.S. Ser. No. 07/694,721, filed May 2, 1991, now U.S. Pat. No. 5,312,684.

BACKGROUND OF THE INVENTION

This invention is directed to threshold switching devices which exhibit negative differential resistance (NDR), and to certain ceramic threshold switching devices which are useful in synthetic neural networks.

The brain distributes its processing tasks among billions of relatively unintelligent nerve cells called neurons. Neural networks are attempts to simulate brainlike functions on conventional computers. Thus, a "synthetic neural network" is the structure of a machine modeled after the brain but not the actions that it performs. Such networks seek to mimic the properties of neurons with electronic components.

A synapse is the contact point between two neurons. A simple network includes a number of such contact points or connections between an input and an output. Values or "weights" are assigned to these connections. Additional layers can be added to the network between the input and the output in the form of hidden units.

It has been found that a device including a silicon dioxide thin film and electrodes, is capable of functioning as an electrical component in the construction of such a synthetic neural network. The device is utilized in the network as a variable resistive element, and in this capacity, the device operates as a synapse with weighting factors between adjacent layers of neuronal processing nodes.

In this application of the device, the resistance of each two-terminal device can be adjusted by applying a voltage pulse of sufficient magnitude to the electrodes of the device, in accordance with a back-propagation algorithm or other representations of the internal learning process which are used to control the learning function of a neural network.

Devices which exhibit threshold switching, and metal oxide devices which exhibit threshold switching with negative differential resistance (NDR) are known in the art. The switching and negative differential resistance (NDR) characteristics of silicon oxide films has also been described in the literature.

The use of thin film silica coatings derived from hydrogen silsesquioxane resin to provide protection and electrical insulation is not new, but the use of those coatings to form switching devices which are useful as synapses is believed to be novel.

Coatings and switching devices formed by depositing a thin hydrogen silsesquioxane derived silicon dioxide film between at least two electrodes and applying a voltage above a threshold voltage across the electrodes, are described in detail in a prior patent application U.S. Ser. No. 07/694,721 filed May 2, 1991, and entitled "Threshold Switching Devices", now U.S. Pat. No. 5,312,684. The present invention involves these and similar devices and the utility of such variable resistors as synapses in neural networks.

SUMMARY OF THE INVENTION

The present invention relates generally to a threshold switching device having negative differential resistance (NDR) which is made by depositing a non-dense silicon dioxide film derived from hydrogen silsesquioxane resin between at least two electrodes. A voltage above a certain threshold voltage is then applied across the electrodes to complete formation of the device.

The device formed in this manner is characterized in that (i) the conductive state of the thin film can be converted to the resistive state with memory by decreasing the applied voltage from a sufficiently high value to a value below the threshold voltage at a sufficiently high rate, (ii) it can be converted from a resistive state to a conductive state with memory by the application of a threshold voltage, (iii) the application of voltage above a threshold voltage results in the film exhibiting stable negative differential resistance, and (iv) the conductive and resistive states have different capacitance values associated therewith.

It has been found that because of these characteristics, the devices of the present invention are capable of functioning as synaptic connections in synthetic neuronal networks and systems. The synaptic function is provided by the voltage controlled resistance of the device. Two dimensional arrays of the devices can be interconnected and used as variable weights in a back-propagation network.

These and other features, objects, and advantages, of the present invention will become more apparent from a consideration of the detailed description of the invention.

BRIEF DESCRIPTION OF THE DRAWINGS

FIG. 1 shows the device in its simplest form.

DETAILED DESCRIPTION OF THE INVENTION

The present invention is based on the discovery that thin films of silicon dioxide derived from hydrogen silsesquioxane resin exhibit novel threshold switching and negative differential resistance (NDR), as well as stable conductive and resistive states.

A matrix of variable resistors is formed from a single layer of a silica thin film sandwiched between two arrays of mutually perpendicular metal stripes which serve as electrodes to devices at their intersections. These devices exhibit a non-linear current-voltage characteristic which makes it possible to switch between a highly resistive OFF state and a more conductive ON state and also to attain any value between these extremes. The symmetry of their characteristics makes it possible for these devices to be used in bipolar networks.

Figure 1:
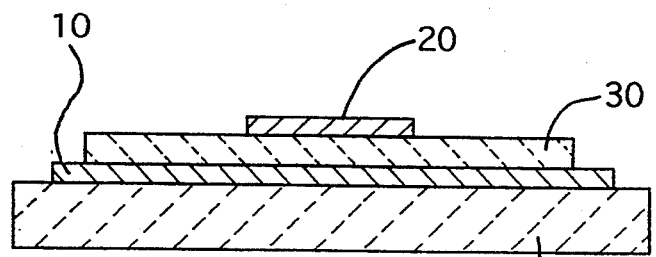
FIG. 1 is pictorial representation and a side view of a cross section of a sandwich device according to the present invention.

FIG. 1 is a cross-sectional view of a representative threshold switching device of this invention wherein electrodes 10 and 20 are separated by the thin film 30. Although FIG. 1 exemplifies a sandwich electrode configuration including a glass substrate 40, this arrangement is not critical and any configuration appropriate for a given device application may be used. For example, such arrangements as coplanar, transplanar, crossed grid arrays, and two-dimensional circular dot patterns may be used.

The shape of the electrodes 10 and 20 and the materials from which they are constructed may be any shape known in the art. The electrodes can be made of any electrically conductive or semiconductive material such as gold, silver, aluminum, platinum, copper, gallium arsenide, nickel, and silicon. Likewise, the electrodes can be used in any shape or form desired, such as a wire or a conventional lead, provided they have at least enough device area to enable the desired current flow. Particularly preferred herein is the use of gold electrodes.

Contact between the electrodes 10 and 20 and the thin film 30 can be established by techniques well known in the art. The electrodes may be formed on the thin film by evaporating or sputtering the appropriate electrode material in vacuum. Alternatively, the thin film 30 may be deposited directly onto preformed electrodes to create the appropriate contact, or the preformed electrodes may be adhered to the thin film by conventional techniques.

The thin films 30 are silicon dioxide derived from hydrogen silsesquioxane resin. Generally, these films may be of any thickness desired. Those in the range of between about 50 and 5,000 nanometer are preferred with those in the range of between about 100 and 600 nanometer being especially preferred. Such thin films 30 may be formed by coating a substrate with a solution comprising a solvent and hydrogen silsesquioxane resin, evaporating the solvent to form a preceramic coating, and then converting the preceramic coating to a thin film.

The thin film 30 is formed with the necessary electrodes 10 and 20 arranged such that a voltage can be applied across the thin film. A device prepared in this manner initially exhibits an undefined, non-specific resistance. For instance, some devices may exhibit resistance values as low as one ohm while others exhibit values above ten megohms. Those with very low resistance often have shorts between the electrodes due to pin holes and other flaws. If present, shorts may be "blown out" by applying a voltage sufficiently high of about 10-20 volt from a low impedance voltage source to vaporize the electrode around the short.

A voltage is then slowly applied across the film of the device and increased until a threshold voltage is reached, at which point, the resistance of the device suddenly falls. Upon such a voltage application, the device is completely formed and it will remain in its low resistance state.

To obtain lower threshold voltages and more reproducible results, the devices of the invention may be placed in a non-oxidizing environment. Examples of suitable environments include nitrogen, argon, helium, and carbon dioxide. Alternatively, however, establishing a vacuum or encapsulating the device can also provide the desired non-oxidizing environment.

The following describes the characteristics of a typical device formed in the above manner, and the procedures to switch the device from its OFF state to an ON state and back again. A typical device includes a silica thin film 30 with a thickness of about 200 nanometer and a device area of about 0.1 $cm^2$ or less. A voltage is applied across the electrodes 10 and 20, and the current through the device and the voltage across the device are measured. The current, measured in ampere (A) is converted to a current density j and reported as $A/cm^2$. The results are plotted in a diagram of current density versus voltage referred to as a jV curve. The values set forth herein are only representative of a typical device and are not meant to be limiting.

Threshold switching, as displayed by this device, is similar to that known in the art for other thin films. As a voltage less than a threshold voltage of about three volts is applied to an electrode, the thin film exhibits a high impedance as would normally be associated with an insulator. The resistivity of the device in this "OFF" state is generally in the range of between about $10^8$ ohm cm and about $10^{11}$ ohm cm. When the applied voltage is raised above the threshold voltage however, the thin film is rapidly converted to a state of low resistivity, and the device supports a high current density. The resistivity in this "ON" state is typically in the range of between about $10^4$ ohm cm and about $10^7$ ohm cm.

Figure 2:
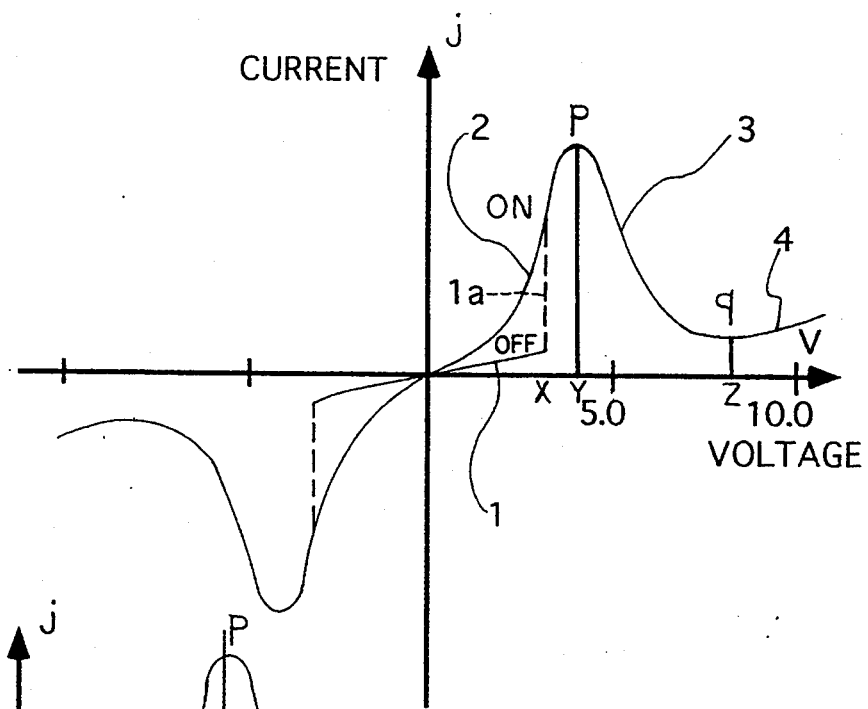
FIG. 2 is a graphical representation in the form of a jV plot of the current density versus the voltage of a device of the present invention illustrating the threshold switching behavior of the device. Current density j is defined as the current in ampere units divided by the surface area of the device in square centimeters.

This threshold switching behavior is graphically displayed in FIG. 2. Line 1 shows that when the device is in the OFF state, the current density increases only slightly as the applied voltage is increased. When the applied voltage reaches the threshold voltage "x" the device rapidly switches from the OFF state to the ON state wherein the current density is suddenly increased by two or three orders of magnitude or more shown by the dotted line. It is essential for the transition to the ON state to occur as depicted schematically in FIG. 2 that the ambient of the device be free of oxygen or other oxidizing gaseous species. This condition pertains throughout the remainder of the discussion of the resistive properties of devices according to this invention.

Figure 3:
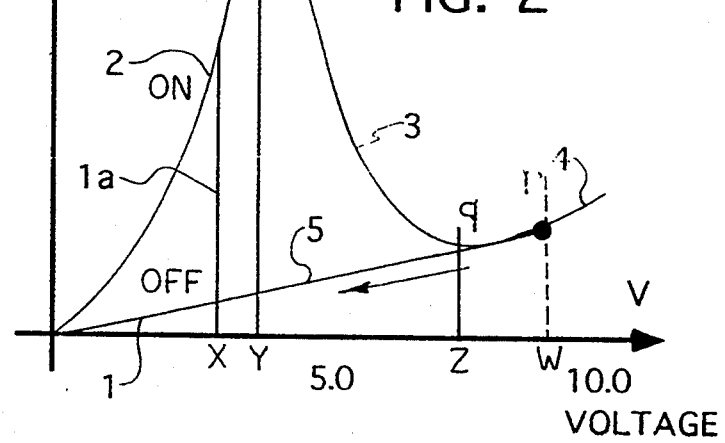
FIG. 3 is graphical representation of a portion of the jV plot of FIG. 2 in more detail.

As can be seen in FIGS. 2 and 3, jV curves for such devices exhibit both linear and non-linear components dependent upon the state of the device. Once in the ON state, the jV tracing follows lines 2, 3 and 4 wherein the current rises steeply with voltage in the first quadrant as shown by line 2 and symmetrically to it in the third quadrant until it reaches a maximum current "p" at a voltage "y". Increasing the voltage beyond this value results in a decrease in current density until a minimum "q" is reached at voltage "z", at which time the device exhibits a voltage-controlled negative differential resistance, or NDR as shown by line 3. Typically the values for "y" range between 4-6 V and for "z" between 8-10 V. At voltages above "z", the jV curve shows the high resistivity characteristic of an insulator which is shown as line 4.

One advantage of a device of this invention is the fact that the jV curve is wide and "stable" in the NDR region, such that no uncontrollable transitions occur as the applied voltage is changed, although the jV curve is noisier in the NDR than in the low voltage portion shown as line 2. Thus, any point on the jV curve can be isolated and maintained, provided the source impedance of the voltage supply is smaller by magnitude than the negative differential resistance of the device at that point.

The jV curve of the device in its ON state can be completely traced out for both increasing and decreasing voltages, through the maximum, at a sufficiently low rate of change of the applied voltage. In particular, the curve is continuous through the origin which means (i) there is no holding current necessary to maintain the ON state, and (ii) the device has a "memory" of the ON state even when no voltage is applied.

To convert the device from the ON state to the OFF state requires that the applied voltage be removed or reduced to a value of about zero at a sufficiently high "slew rate" from a voltage above "z". As shown in FIG. 3, the jV curve of the device does not go through the current peak "p" when the applied voltage is rapidly lowered in this manner. Rather, it follows a direct nearly linear path shown by line 5. Slew rates for efficiently switching the device OFF are greater than about one volt per millisecond with rates greater than about 1000 V/mS being preferred. It is to be noted that a device in the ON state may be turned OFF by a voltage pulse starting at zero, provided the pulse voltage is larger, or approximately equal to "z" wherein the pulse reaches line 4, and the fall time of the pulse meets the slew rate requirement. Typically, a voltage of ten volts for a duration of one microsecond or less is adequate.

When the device is turned OFF in the above manner, it has a high resistance, typically two or three orders of magnitude higher than its resistance in the ON state. The resistance can be determined by measuring the jV curve in the OFF state over a small range of the applied voltage up to the threshold voltage. The device will remain in the OFF state as long as the applied voltage does not exceed the threshold voltage. Such a device in the OFF state can be converted to the ON state as described above.

It has been determined that the application of voltage pulses that vary between the threshold voltage "x" in FIG. 3 and the current minimum at point "q" at "z" volts in FIG. 3 results in device resistances ranging between the fully ON and the fully OFF state.

Figure 4:
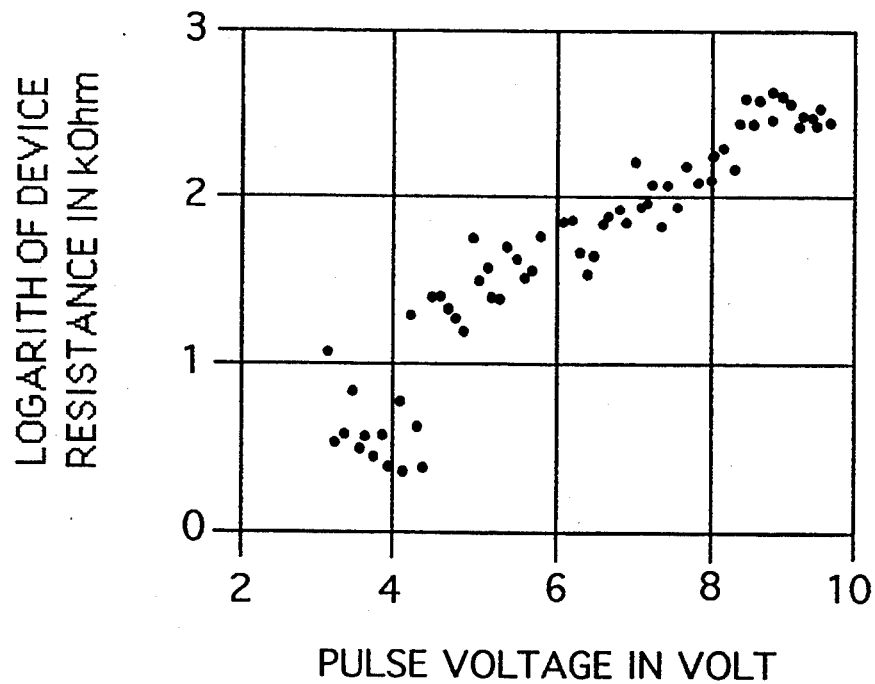
FIG. 4 is a graphical representation in a semi-logarithmic plot of the pulse voltage versus resistance of a device of the present invention to depict graphically the functional relationship between the pulse voltage and the resistance.

FIG. 4 depicts the functional dependence of the resistance of the device on the pulse voltage. The resistance data are plotted logarithmically (base 10) on the ordinate axis. FIG. 4 shows that the resistance increases with increasing pulse voltage, covering a continuous range of resistance values of more than two orders of magnitude.

Figure 5:
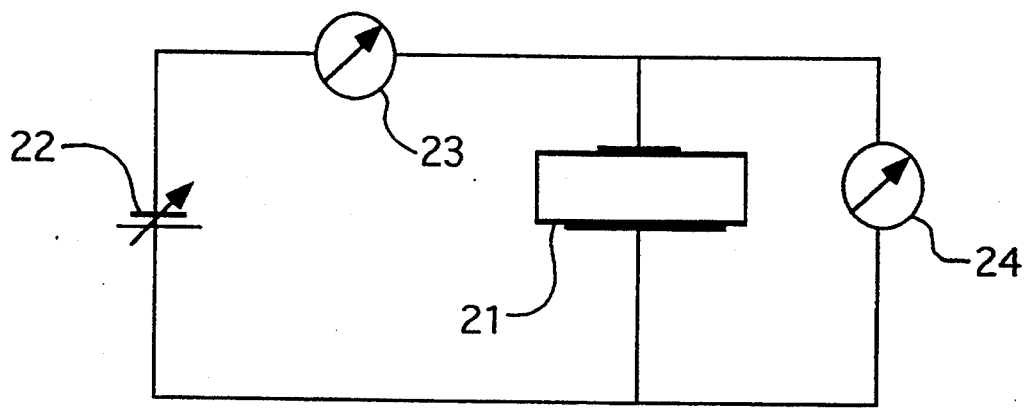
FIG. 5 is a schematic wiring diagram of a device according to the present invention in a test circuit for measuring and changing the resistance of the device.

The device of FIG. 1 can be placed in an electrical circuit as illustrated in FIG. 5 to show its function as a resistor. The device 21 is connected to a variable voltage source 22 with a current meter 23 wired in series. The current meter 23 can be a calibrated measurement resistor and a voltmeter to measure the voltage drop. A voltmeter 24 connected across the two terminals of the device measures the voltage applied to the device.

The variable voltage source 22 provides two functions. It serves as a voltage source to which the variable resistor is connected to obtain a current according to the device resistance at voltages below the threshold voltage of the device. In this mode, the jV curves of the resistor at its two extreme resistance values can be obtained.

The voltage source 22 also serves as the source for the pulse voltages with which the resistance of the variable resistor device can be altered. Data points can be obtained by pulsing the resistor with a voltage (abscissa values) and measuring the current through the resistor at an applied voltage of one volt. The resistance calculated from the measured values can then be plotted logarithmically.

The computational principle which underlies the general neural network model has developed different systems: (i) perceptrons, (ii) Hopfield networks and Boltzmann machines with associated memory, and (iii) multi-layer feed-forward networks using the generalized delta rule with error back-propagation algorithms. The two principal components of these neural networks are a threshold logic unit, also called "neuron". Neurons are usually arranged in layers and are functionally interconnected. Modifiable connections of variable strength (adaptive weights) are provided between the output of a neuron and the inputs of other neurons, also called "synapses". The adaptive weights are usually arranged in arrays or matrices.

While it is possible to emulate a neural network and its information processing features in software on a digital computer, this simulation approach to neural networks does not take advantage of the capabilities offered by the hardware implementation of logic units and interconnects already available from VSLI technology. However, the hardware implementation of the adaptive synaptic weights as variable resistors is difficult. Resistors that can have various values of resistance are usually realized as arrays of unit resistors connected to the summing point of an amplifier through binary switches under digital control. This requires the integration of multiple elements and metalization lines combined with address select, read/write, and memory units for each synapsis which complicates the lay-out of the design and limits the integration density as well as, for yield reasons, the total number of adaptive weights available for a neural network.

The problem is to design and fabricate a matrix (two-dimensional array) of synaptic resistors (adaptive weights) for interconnecting neuronal layers which is simple to integrate in existing VLSI technology, which consists of a small number of elements per adaptive weight, each of which is easily modifiable (i.e., electrically alterable), has a wide dynamic range, and can be used bi-directionally and with bi-polar signals.

The solution is to use as a variable weight synapsis, a novel single layer thin film switching device that is based on non-dense silica made from a hydridosilsesquioxane precursor and which has a non-linear voltage-current characteristic with negative differential conductance regime. This device can be switched from a highly resistive OFF state to a more conducting ON state or to any value between these two extremes. The range of resistances accessible in this way exceeds a factor of 1000 with the high resistance value typically of the order of megohms. Only the two device electrodes are required for selecting the device and altering its resistance (in ADDRESS SELECT and WEIGHT ADJUST mode) so that the two mutually perpendicular metal stripe arrays which form the matrix of synapses between their crossings at the same time connect to the neuronal threshold units (in READ mode) where the contribution from each synaptic weight is summed. While simple synaptic matrices do not require any other auxiliary circuitry, more complex array structures for which the number of synapses connecting to each input (or output) of a neuron would exceed the dynamic range of the individual synaptic connection, can be equipped with ADDRESS SELECT circuitry comprising word select and bit select lines, and individual weight access gates (transistors) as well as circuitry to decouple the neurons from the synapses during the switching procedure, which are used to alter the synaptic weights (device resistances).

Figure 6A:
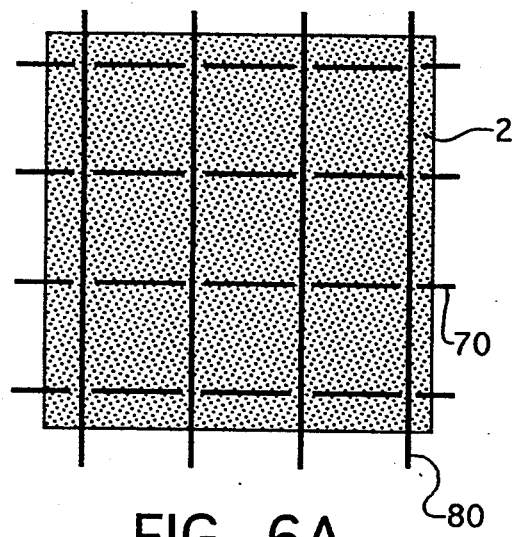
FIGS. 6A and 6B are top views of a portion of a two-dimensional matrix of interconnection weights utilizing the device of FIG. 1.
Figure 6B:
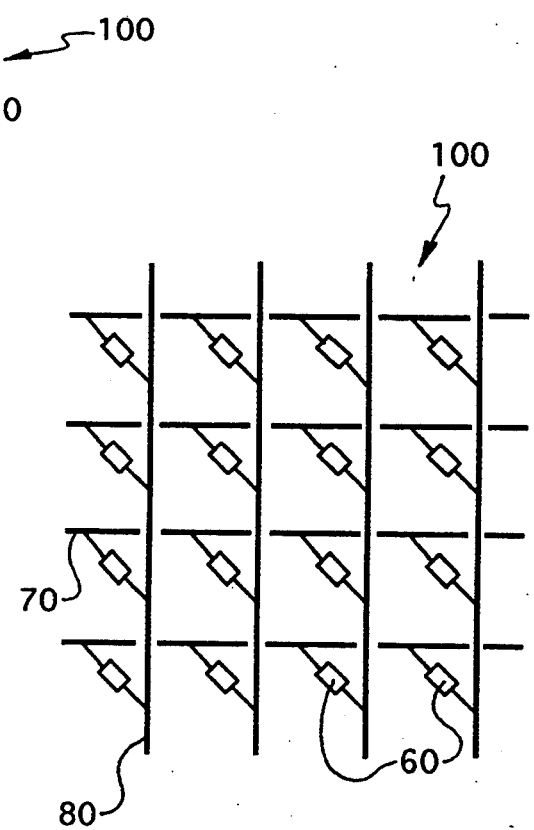

In FIGS. 6A and 6B there will be seen top views of a two-dimensional matrix device 100 which is formed between the crossing points of two mutually perpendicular arrays of metal stripes 70 and 80 which serve as the electrodes and contacts for each device. FIG. 6A shows a single silica layer 20 derived from a hydrogen silsesquioxane resin common to all individual devices formed between the horizontal bottom electrodes 70 and the vertical top electrodes 80. FIG. 6B shows the same array 100 including a symbolic representation 60 of the variable resistors formed in this fashion and which is intended to function as adaptive weight $w_{ij}$.

Figure 7:
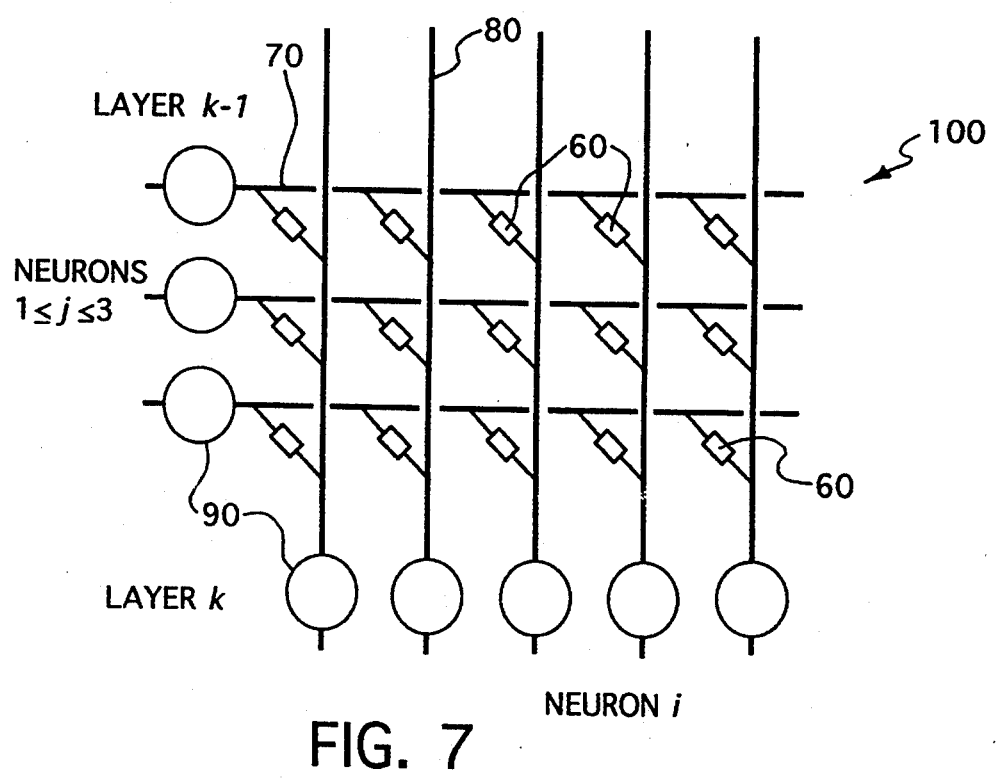
FIG. 7 is a functional representation of the matrix of FIG. 6B in its interconnection with neurons.

FIG. 7 illustrates a matrix 100 of variable resistors 60 used as adaptive weight synapses in a typical feedforward connection between two layers of neuronal threshold units 90. The arrangement provides for a connection between the output sj of each neuron j in one layer k−1 to the input of each neuron i in the next layer k. The arrangement includes a symbolic representation 90 for the neuron (trans-impedance amplifier). The resistance of each resistor 60 can be described as its weight $w_{ij}$ with which it allows neuron j to contribute to the output $s_i$ of neuron i in layer k, in accordance with the equation $s_i = \Sigma_j w_{ij} s_j$.

Figure 8A:
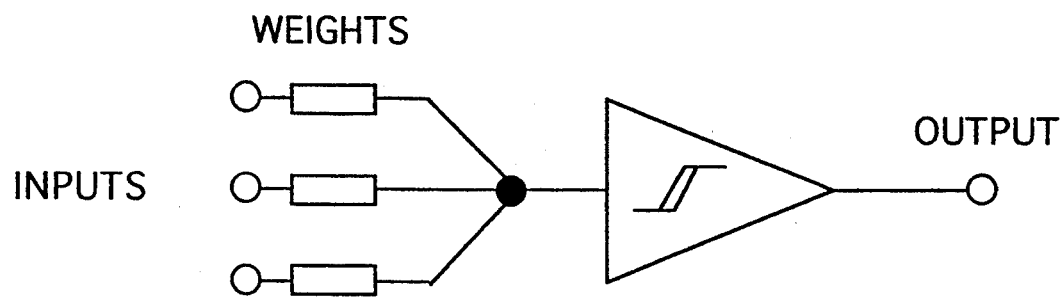
FIG. 8A is an electronic model of a neuron.
Figure 8B:
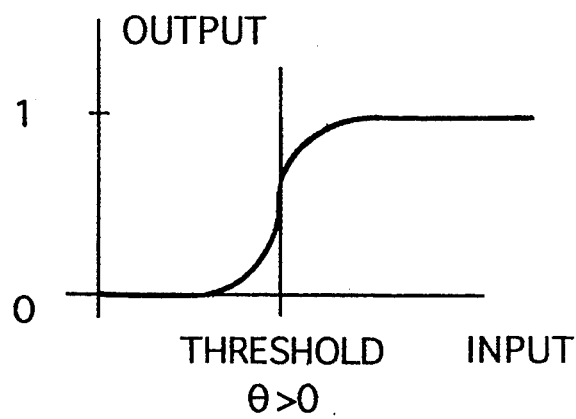
FIGS. 8B and 8C are graphical representations of transfer functions of the neuron shown in FIG. 8A.
Figure 8C:
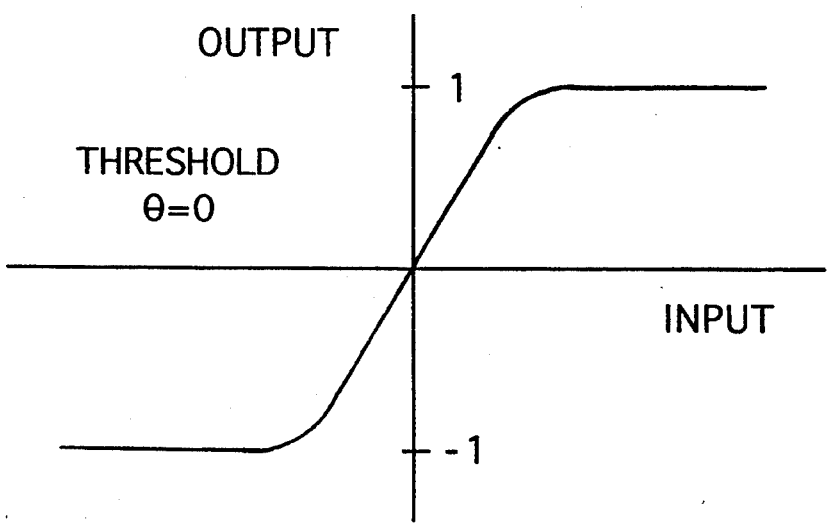

The neurons have a non-linear input-output transfer function as shown in FIGS. 8 A-C for two different cases. This is realized with an operational amplifier whose output voltage equals the sum of the currents flowing into its input (trans-impedance amplifier), and a Schmitt trigger to provide both a unified output signal $s_j$ of either +1 or 0 as shown in FIG. 8B, or +1 or −1 as shown in FIG. 8C, depending upon the particular function desired and an input threshold $\theta_i$. Instead of realizing the threshold by a Schmitt trigger, a bias current can be fed into the input of the neuronal trans-impedance amplifier. This bias is derived from a "true unit" or bias neuron with a constant unity output which is permanently connected to all other neurons through weights $w_{io}$. Thus, FIGS. 8 A-C provide an electronic model of a neuron with summing current input and voltage output (trans-impedance amplifier), showing two different transfer functions, as in FIG. 8B where the output range is between 0 and +1 with threshold $\theta > 0$ realized by a Schmitt trigger, and FIG. 8C where the output range is between −1 and +1 without threshold $\theta = 0$.

Figure 9:
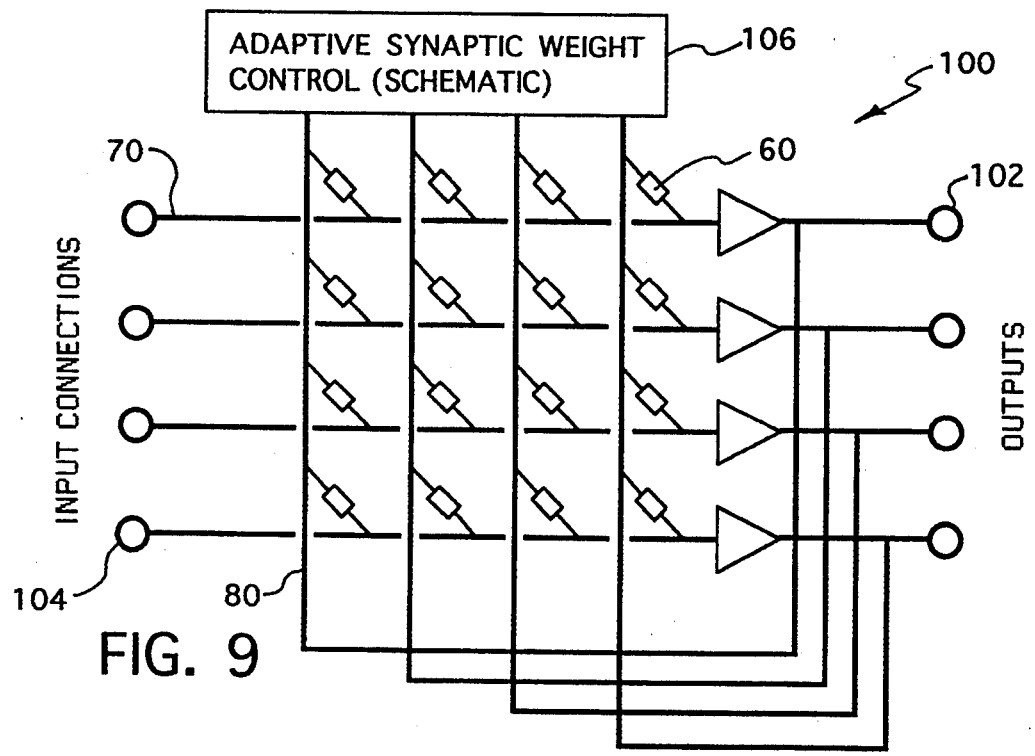
FIG. 9 is a functional representation of a Hopfield neural network including the devices of the present invention.

The use of an array 100 of variable resistors as adaptive synaptic weights in a neural network is shown in FIG. 9 for the case of a Hopfield network. This includes a collection of neurons as shown in FIG. 7 which are all connected to each other so that the output of neuron j connects to the input of neuron i, and that of neuron i connects to neuron j; with the conditions that i is not equal to j, that is $w_{ii} = 0$; and $w_{ji} = w_{ij}$ in which case the interaction between neurons is symmetric.

In FIG. 9, the Hopfield network can be seen to include four neurons and sixteen synaptic weights 60. The threshold of each neuron is assumed to be zero with the output ranges being between −1 and +1. The output of the neurons is fed back to the input through the synaptic weights in the array 100 which are implemented by the variable resistive elements 60 of the present invention. The network is fully connected with each output 102 connected to all inputs 104. The connection of each neuron to its own input is open, that is $w_{ii} = 0$. In a symmetrical neural network for each pair of neurons i and j, the weights are equal $w_{ji} = w_{ij}$. FIG. 9 also illustrates the electronic circuitry 106 for changing the adaptive synaptic weights with suitable voltage pulses during the learning phase when desired output patterns are matched to given input patterns. Once the neural network has learned a configuration of patterns, the control circuitry 106 is no longer necessary.

Figure 10:
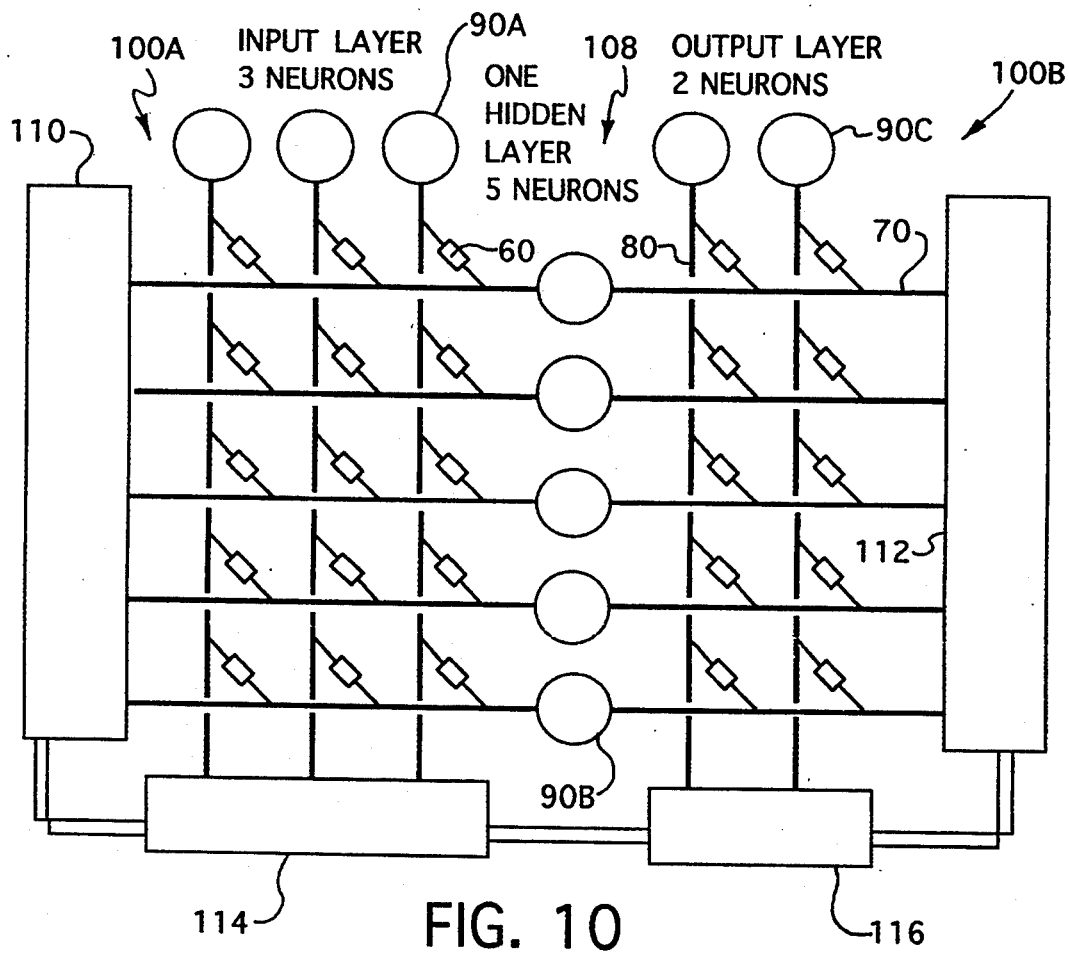
FIG. 10 is a functional representation of a feedforward neural networking according to the present invention.

In FIG. 10 there is shown a layered feedforward network in which the one hidden layer 108 is connected to both the input layer and the output layer of neurons through two arrays 100A and 100B of synapses implemented by the variable resistive elements 60 of the invention. This neural network is capable of learning input/output correlations by adjusting the resistances of the synaptic connections. This can be accomplished by utilizing the generalized delta rule with a back-propagation algorithm to minimize the discrepancy between the associated output and the desired output. This learning scheme can be equally applied to layered networks with more than one hidden layer, in which case a similar array of adaptive weights provides the synaptic connections between each of these layers. Once a correlation of input/output patterns has been learned, FIG. 10 can be employed without the back-propagation network as a general perceptron structure in which an excitation pattern presented to the input layer results in a specific response at the output layer.

As depicted in FIG. 10, the feedforward neural network includes three neurons in the input layer, five neurons in the hidden layer, and two neurons in the output layer. The neurons are depicted schematically as circles, and their thresholds are implied; that is the bias neurons are not shown explicitly. The neuronal layers are interconnected with two synaptic arrays 100A and 100B of adaptive weights implemented by the variable resistive elements 60 of the present invention. FIG. 10 includes appropriate electronic circuitry for changing the adaptive synaptic weights with suitable voltage pulses during the learning phase when desired output patterns are matched to given input patterns. The circuitry includes auxiliary circuitry for WRITE and ADDRESS SELECT control indicated schematically as boxes 110, 112, 114, and 116. Once the neural network has learned a configuration the electronic control circuitry is no longer necessary.

The advantages of the present invention are numerous. Thus, each variable weight synapsis is completely bi-directional and current flow can, therefore, occur in either direction through a synapsis. It is also completely bi-polar, that is, it operates under both positive and negative signal polarities and can, therefore, be used for neuronal outputs of either polarity, especially neurons with standardized output of −1 V ("quiescent") or +1 V ("excited"). For operation of the synaptic matrix, there is no other electrical connection or electrode required besides the rows and columns of electrodes to the synaptic weights. Neither a supply voltage nor a holding voltage is necessary since each resistor element retains its programmed resistance value without electrical power. The wide dynamic range of weights (resistance values) available with each synaptic element makes it also possible to replace a ladder of binary switches connected to an R/2R network as a variable resistor with a single programmable (and non-volatile) resistor element. Both space and power dissipation advantages are gained in this way.

Other advantages of the use of hydrogen silsesquioxane resin derived silica variable resistance switching devices in these applications include a) simplicity of structure—one silica layer per device with only two electrodes; b) compatibility with silicon, and generally the group IV, III–V, and II–VI semiconductors, in the integrated circuit manufacturing process of the electronic industry; c) suitability for VSLI implementation of neural networks in hardware; d) absence of electrolytes (solid state or otherwise); and e) high stability.

The general synaptic matrix (n rows, m columns) shown in FIG. 7 can be directly connected between neuronal layers in such applications as perceptrons which comprise several such layers in a simple forward connection mode. Other applications of these synaptic matrices include models of biological neural circuits for associative memory and general pattern recognition tasks. A square matrix (equal number of rows and columns) can be used in a Hopfield-type neural network where the elements $w_{ij}$ of the (square) synaptic matrix are connected between all outputs j and inputs i except for i=j, that is $w_{jj}$=0. Similarly, these synaptic matrices are suitable for use in neural networks which employ error back-propagation algorithms to adjust the synaptic weights between neurons in automatic or supervised learning.

The thin film silica coatings derived from hydrogen silsesquioxane resin can be distinguished from the many coatings existing in the prior art by a consideration of their unique characteristics which are manifested as follows.

Initially, as a voltage below a threshold voltage "x" is applied to the device in the OFF state, the current follows an essentially linear relationship along line 1. When the threshold voltage "x" is reached however, line 1a in FIGS. 2 and 3 indicates a rapid linear transition from the OFF state of the device to ON state in which the current varies in a non-linear fashion. As the voltage is increased beyond the threshold voltage "x", a current maximum or current peak "p" is reached at voltage "y".

Once the ON characteristic of the device is established, a decrease of the voltage from "y" to zero for example, causes the current to decrease along line 2 rather than retracting lines 1a and 1. On the other hand, voltage increases beyond "y" effect a decrease of current along line 3 to the current minimum or current valley "q" at voltage "z". Horizontal tangents drawn on the curve at points "p" and "q" define the NDR or the region of negative differential resistance along line 3 between the tangents.

Until the voltage exceeds the voltage "z", the device remains in the ON state and is free to cycle slowly along lines 2 and 3. The device may be switched to the OFF state by increasing the voltage beyond "z" to "w" for example, and rapidly removing the applied voltage. This causes the current to decrease to zero at a lower current level and in an essentially linear fashion from the return point "r" in FIG. 3 in a path along lines 4, 5, and 1. The device remains in the OFF state as long as the magnitude of any subsequently applied voltage, either positive or negative, does not exceed the threshold voltage "x". If the subsequently applied voltage does exceed the threshold voltage "x", the device is switched back to the ON state.

The jV curves according to FIGS. 2 and 3 therefore can be seen to exhibit both linear and non-linear regions for a device. The jV curve has a first non-linear region 2 wherein increasing the voltage applied to the device increases the current to a current maximum or peak "p", followed by a second non-linear region of negative differential resistance 3 wherein increasing voltage applied to the device decreases the current to a current minimum or valley "q", while the voltage is increasing.

The jV curve has a third region 5 capable of being activating by a voltage in excess of the voltage "z" at the current minimum "q", at which time a rapid removal of an applied voltage "w" causes the current to decrease from point "r" in a linear fashion along lines 5 and 1.

The jV curve has a fourth region 1a wherein an increase of voltage applied to the device up to a threshold voltage "x" causes a rapid transition from a linear current increase to a non-linear increase in region 2 up to a current maximum or peak "p", at which peak "p" regions 2 and 3 merge.

Other variations and modifications may be made in the compounds, compositions, methods, devices, and articles of manufacture, described herein without departing from the essential features and concepts of the present invention. The forms of the invention described herein are exemplary only and are not intended as limitations on the scope of the invention as defined in the appended claims.

That which is claimed is:

1. In a synthetic neural network including a plurality of neuronal elements arranged in an input layer, an output layer, and a hidden layer between the input layer and the output layer, the network further including a first plurality of synaptic weighting elements interconnecting the neuronal elements of the input layer with the neuronal elements of the hidden layer, and a second plurality of synaptic weighting elements interconnecting the neuronal elements of the hidden layer with the neuronal elements of the output layer, the improvement comprising the synaptic weighting elements in the synthetic neural network being in the form of a silicon dioxide film derived from the oxidation of a hydrogen silsesquioxane resin, the silicon dioxide film being characterized by a jV (wherein jV designates current-voltage) curve which includes both linear and non-linear regions, the jV curve of the silicon dioxide film including: (i) a first non-linear region wherein increasing the voltage applied to the film increases the current to a current maximum; followed by (ii) a second non-linear region of a negative differential resistance wherein increasing voltage applied to the film decreases the current to a current minimum while the voltage is increasing; the jV curve of the silicon dioxide film including (iii) a third region capable of being activated by a voltage in excess of the voltage at the current minimum, at which time a rapid removal of the excess voltage causes the current to decrease in a linear fashion; and the jV curve of the silicon dioxide film including (iv) a fourth region wherein an increase of voltage applied to the film up to a threshold voltage causes a rapid transition from a linear current increase to a non-linear current increase which continues to the current maximum.

2. The network of claim 1 wherein the film thickness is between about 50 and about 5000 nm.

3. The network of claim 2 wherein the film thickness is between about 100 and about 600 nm.

4. The network of claim 1 wherein one or more modifying ceramic oxides are incorporated in the film.

5. The network of claim 4 wherein the modifying ceramic oxide is an element selected from the group consisting of iron, titanium, zirconium, aluminum, tantalum, vanadium, niobium, boron and phosphorous, present in an amount such that the film contains 0.1 to 30 percent by weight of the modifying ceramic oxide.

6. An array comprising a first plurality of neuronal elements arranged in a first layer and a second plurality of neuronal elements arranged in a second layer, the first layer and the second layer of neuronal elements each having inputs and outputs, row electrodes and column electrodes connected to the inputs and outputs of the first and second layers of neuronal elements, and at least one synaptic weighting element in the form of a variable resistive element connected between the output of a neuronal element in the first layer and the input of a neuronal in the second layer, the variable resistive element being a non-fully densified silicon dioxide film derived from a hydrogen silsesquioxane resin and including electrical contacts for applying an electrical potential across the film, the silicon dioxide film being characterized by a conductive and a resistive state between which transitions can be induced by the application of voltage pulses, the silicon dioxide film being further characterized by a jV (wherein jV designates current-voltage) curve which includes both linear and non-linear regions for the resistive element, the jV curve of the silicon dioxide film including: (i) a first non-linear region wherein increasing the voltage applied to the film increases the current to a current maximum; the first non-linear region being followed by (ii) a second non-linear region of a negative differential resistance wherein increasing the voltage applied to the film decreases the current to a current minimum while the voltage is increasing; the jV curve of the silicon dioxide film including (iii) a third region capable of being activated by a voltage in excess of the voltage at the current minimum, at which time a rapid removal of the excess voltage causes the current to decrease in a linear fashion; and the jV curve of the silicon dioxide film including (iv) a fourth region wherein an increase of voltage applied to the film up to a threshold voltage causes a rapid transition from a linear current increase to a non-linear current increase which continues to the current maximum.

7. The array according to claim 6 in which the variable resistive element is placed in a non-oxidizing environment.

8. The array according to claim 6 in which there are a plurality of said variable resistive elements connected between the outputs of the first layer and the inputs of the second layer.

9. The array according to claim 6 in which the output of each neuronal element in the array is connected to its input.

10. The array according to claim 9 including control circuitry connected to the array for changing the adaptive synaptic weight of the synaptic weighting elements in the array by the application of voltage pulses.

11. The array according to claim 6 in the form of a network in which a third plurality of neuronal elements form a hidden layer with the hidden layer being disposed between and interconnected with the first layer and the second layer of neuronal elements.

12. The network according to claim 11 including control circuitry connected to the array for changing the adaptive synaptic weight of the synaptic weighting elements in the array by the application of voltage pulses.

13. The network according to claim 12 including auxiliary control circuitry interconnected with the array for the control of WRITE and ADDRESS SELECT.

* * * * *